(12) United States Patent
Ematrudo et al.

(10) Patent No.: US 6,246,619 B1
(45) Date of Patent: Jun. 12, 2001

(54) SELF-REFRESH TEST TIME REDUCTION SCHEME

(75) Inventors: Christopher Ematrudo, Campbell; Jeffrey S. Earl, San Jose; Michael C. Stephens, Jr., San Jose; Luigi Ternullo, Jr., San Jose; Michael F. Vincent, San Jose, all of CA (US)

(73) Assignee: Vanguard International Semiconductor Corp., Hsin-chu (TW)

( * ) Notice: Subject to any disclaimer, the term of this patent is extended or adjusted under 35 U.S.C. 154(b) by 0 days.

(21) Appl. No.: 09/498,985

(22) Filed: Feb. 7, 2000

(51) Int. Cl.[7] .................................................. G11C 29/00
(52) U.S. Cl. ........................ 365/201; 365/222; 365/236; 365/230.06
(58) Field of Search ................................. 365/201, 222, 365/236, 230.06, 190

(56) References Cited

U.S. PATENT DOCUMENTS

| | | | |
|---|---|---|---|
| 5,321,661 | 6/1994 | Iwakiri et al. | 365/222 |
| 5,321,662 * | 6/1994 | Ogawa | 365/222 |
| 5,450,364 | 9/1995 | Stephens, Jr. et al. | 365/222 |
| 5,625,597 | 4/1997 | Hirose | 365/201 |
| 5,793,776 | 8/1998 | Qureshi et al. | 714/724 |
| 5,835,401 * | 11/1998 | Green et al. | 365/149 |
| 5,995,433 * | 11/1999 | Liao | 365/222 |
| 6,118,710 * | 9/2000 | Tsuji | 365/200 |

* cited by examiner

*Primary Examiner*—Andrew Q. Tran
(74) *Attorney, Agent, or Firm*—George O. Saile; Stephen B. Ackerman

(57) ABSTRACT

A circuit for a DRAM is described which, when in test mode, notifies a tester when the self-refresh operation of a dynamic random access memory (DRAM) reaches various stages of completion. By signaling the tester when, i.e., ⅛, ¼, ½, etc. of the self-refresh cycle is reached, the amount of time needed for verification of the self-refresh oscillator frequency is reduced correspondingly by a factor of 8, 4, 2 etc. The signaling of a partial test time is achieved by adding self-refresh status logic circuits which decode the high order most significant bits of the refresh address counter. The activation of the third most significant bit signals completion of ⅛th of the self-refresh cycle, the activation of the second most significant bit signals completion of ¼th of the self-refresh cycle, the activation of the most significant bit signals completion of ½ of the self-refresh cycle, and deactivation of the most significant bit signals completion of the self-refresh cycle.

21 Claims, 5 Drawing Sheets

SELF-REFRESH TEST TIME REDUCTION SCHEME

BACKGROUND OF THE INVENTION

1. Field of the Invention

The invention relates to dynamic random access memories (DRAM), and more particularly to means of reducing the manufacturing test time of DRAMs required to verify the self-refresh oscillator frequency through the use of logic functions.

2. Description of the Related Art

The present state of the art in verifying the self-refresh oscillator frequency requires the completion of a self-refresh operation for the entire DRAM. For a typical industry standard DRAM of 8k rows (8192 rows), with two rows active at a time, this requires a minimum of 64 ms test time. This time, however, is typically greater than 64 ms because the self-refresh operation is optimized to reduce current consumption and this is usually accomplished through lower self-refresh oscillator frequencies and, thus, a longer self-refresh period. This extra time is not insignificant, because of the large number of DRAMs that are tested routinely.

U.S. Patents pertinent to testing of the self-refresh operation are:

U.S. Pat. No. 5,450,364 (Stephens Jr. et al.) describes a method and apparatus for testing the self-refresh operation of a dynamic memory part. The apparatus provides an oscillator, coupled to a self-refresh counter. The self-refresh counter causes a refresh row address counter to generate row addresses for self-refresh cycles. The refresh row address counter is coupled to a self-refresh control circuit. The self-refresh control circuit is operable to generate a signal indicating completion of a self-refresh cycle. The refresh row address counter is also coupled to a multiplexer. The multiplexer outputs row addresses from either the refresh row address counter or those supplied externally for rows to be refreshed.

U.S. Pat. No. 5,321,661 (Iwakiri et al.) teaches a self-refreshing memory. The self-refreshing memory has a refresh timer that generates refresh requests at a certain rate, and a refresh address counter that generates refresh addresses by counting the refresh requests. A refresh test circuit receives test signals from automatic test equipment that cause it to disable the refresh timer, reset the refresh address counter, then enable the refresh timer for a certain interval. At the end of this interval the refresh test circuit disables the refresh timer again and generates an output signal such as a serial data signal indicating the current refresh address, or a pass-fail signal indicating whether the refresh address is equal to or greater than a preset pass value.

U.S. Pat. No. 5,793,776 (Qureshi et al.) shows a JTAG test logic and a memory controller that places an SDRAM in a self-refresh mode prior to beginning JTAG testing.

U.S. Pat. No. 5,625,597 (Hirose) provides a circuit structure capable of carrying out the function test of the refresh counter and the measurement of the counter cycle at the time of the refresh operation. A test control circuit is provided for carrying out the function test of the refresh counter and the measurement of the counter cycle at the time of the refresh operation, and controls the driving signals so as to set one of the N-channel sense amplifier and the P-channel sense amplifier in a non-active state at the time of a test mode.

It should be noted that none of the above-cited examples of the related art propose to shorten the manufacturing test time in an effort to decrease production costs.

SUMMARY OF THE INVENTION

It is an object of the present invention to provide circuits and a method which allow for a reduction in the manufacturing test time required to verify the self-refresh oscillator frequency of a DRAM.

Another object of the present invention is to be able to signal to the tester when the self-refresh operation has reached a portion of the self-refresh cycle, e.g., when the operation has reached ⅛, ¼, ½, full completion, or any other desired fraction of the self-refresh cycle.

These objects have been achieved when, having invoked the test mode, the DRAM notifies the tester when the self-refresh operation reaches various stages of completion. By signaling the tester after, i.e., ⅛, ¼, ½, etc. of the self-refresh cycle the amount of time needed for verification of the self-refresh oscillator frequency is reduced correspondingly by a factor of 8, 4, or 2. The signaling of a partial test time is achieved by adding self-refresh status logic circuits which decode the high order most significant bits of the refresh address counter and signal the tester that ⅛, ¼, etc. of the cycle have been reached. E.g., the activation of the third most significant bit signals completion of ⅛th of the self-refresh cycle, the activation of the second most significant bit signals completion of ¼th of the self-refresh cycle, the activation of the most significant bit signals completion of ½ of the self-refresh cycle, and deactivation of the most significant bit signals completion of the self-refresh cycle. Any combination of bits may be used to signal a particular partial completion of the self-refresh cycle.

DESCRIPTION OF THE PREFERRED EMBODIMENT

Figure 1:
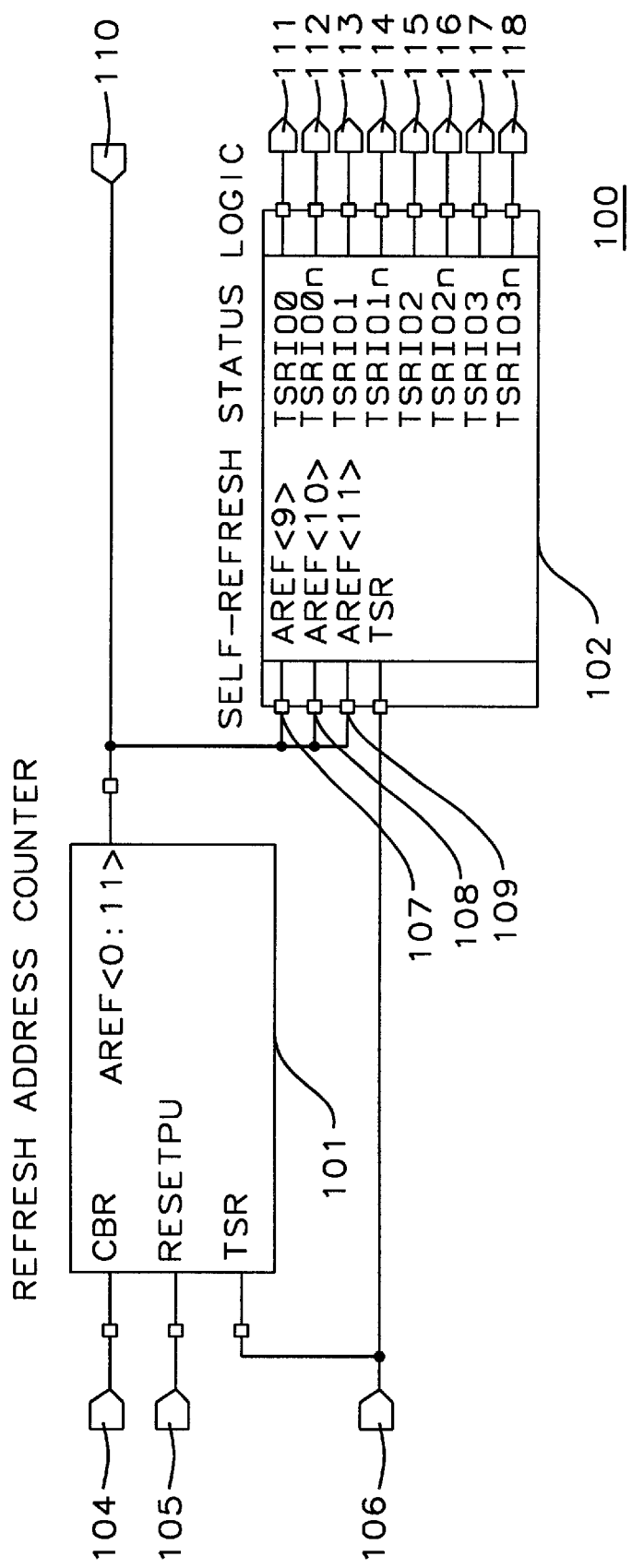
FIG. 1 is a block diagram of the present invention.

The preferred embodiment of the present invention utilizes logic functions to report the status of the self-refresh operation while it is executing through invocation of a test mode. When this test mode is enabled the DRAM notifies the tester when the self-refresh operation reaches various stages of completion. In the embodiment of the invention, the DRAM signals the tester when the self-refresh operation reached one eighth, one fourth, one half, and whole levels of completion.

Utilizing this test mode allows for a reduction in test time required to determine the self-refresh time as dictated by the internal dynamic random access memory (DRAM) self-refresh oscillator. As implemented the test mode allows for a reduction in test time by a factor of eight and the test mode can easily be extended to provide further factors of reduction until a point when the degree of accuracy sacrificed is too large. Is is also possible to select some other reduction of test time such as the fraction ⅜ or any other fraction.

The test mode is invoked prior to the start of the self-refresh operation. In this embodiment the test mode is invoked through a test register (not shown) within the mode register (not shown) of a synchronous DRAM, but the test mode is by no means limited to synchronous style DRAM designs. When invoked, the test mode enables the output circuitry of four data out pin pairs (in-phase & out-of-phase) for reporting the stages of completion of the process; there is one pin pair for each level of completion to be reported.

In a normal self-refresh operation, the DRAM will cycle through its row address space using a counter operating at a low frequency which is dictated by an on-chip oscillator. With the test mode invoked, the DRAM will still cycle through its row address space as in a normal self-refresh operation, with the only difference being that the refresh address counter 101 of FIG. 1 will be reset to zero upon test mode invocation (input 106 to counter 101).

In the design used to verify this invention (self-refresh test time reduction circuit 100 of FIG. 1, to which we refer now) there exist 8K rows of which two are active per row operation and thus a twelve bit refresh address counter 101 is required to perform refresh operations. During self-refresh with the test mode (input 106) enabled, the self-refresh status logic 102 will monitor refresh addresses 9, 10, and 11 (aref<9> input 107, aref<10> input 108, and aref<11> input 109, from bus aref<0:11> output 110) to determine the stages of completion. The activation of refresh address 9 would signify 1024 rows have been refreshed and thus the operation is one eighth complete. The activation of refresh address 10 would signify 2048 rows have been refreshed and the operation is one fourth complete. The activation of refresh address 11 would signify that 4096 rows have been refreshed and the operation is one half complete. Finally, the deactivation of refresh address 11 would signify that the row address space has been refreshed, the counter has returned to zero, and the refresh operation has completed. However, any combination of address bits may be used to signal a particular partial completion of the self-refresh cycle.

The following TABLE 1 summarizes the relationship of input addresses aref<nn> vs. completion stage vs. tsrio(n) output pins when test mode is active:

TABLE 1

| address aref | | | cycle | output tsrio to tester | | | |
|---|---|---|---|---|---|---|---|
| <9> | <10> | <11> | complete | 0 | 1 | 2 | 3 |
| 1 | 0 | 0 | 1/8 | 1 | 0 | 0 | 0 |
| x | 1 | 0 | 1/4 | 1 | 1 | 0 | 0 |
| x | x | 1 | 1/2 | 1 | 1 | 1 | 0 |
| x | x | 0 | all | 1 | 1 | 1 | 1 | where x denotes a "don't care"

where x denotes a "don't care"

Still referring to FIG. 1, refresh address counter 101 also has input cbr (104) for incrementing counter 101 and input resetpu (105) for resetting of counter 101 when not in test mode. Self-refresh status logic 102, in addition to inputs 106, 107, 108, and 109, has outputs 111 to 118, with signal names tsrio0, tsrio0n, tsrio1, tsrio1n, tsrio2, tsrio2n, tsrio3, and tsrio3n, respectively, where signals with the suffix "n" indicate out-of-phase signals (equal to the even numbered outputs).

Figure 2A:
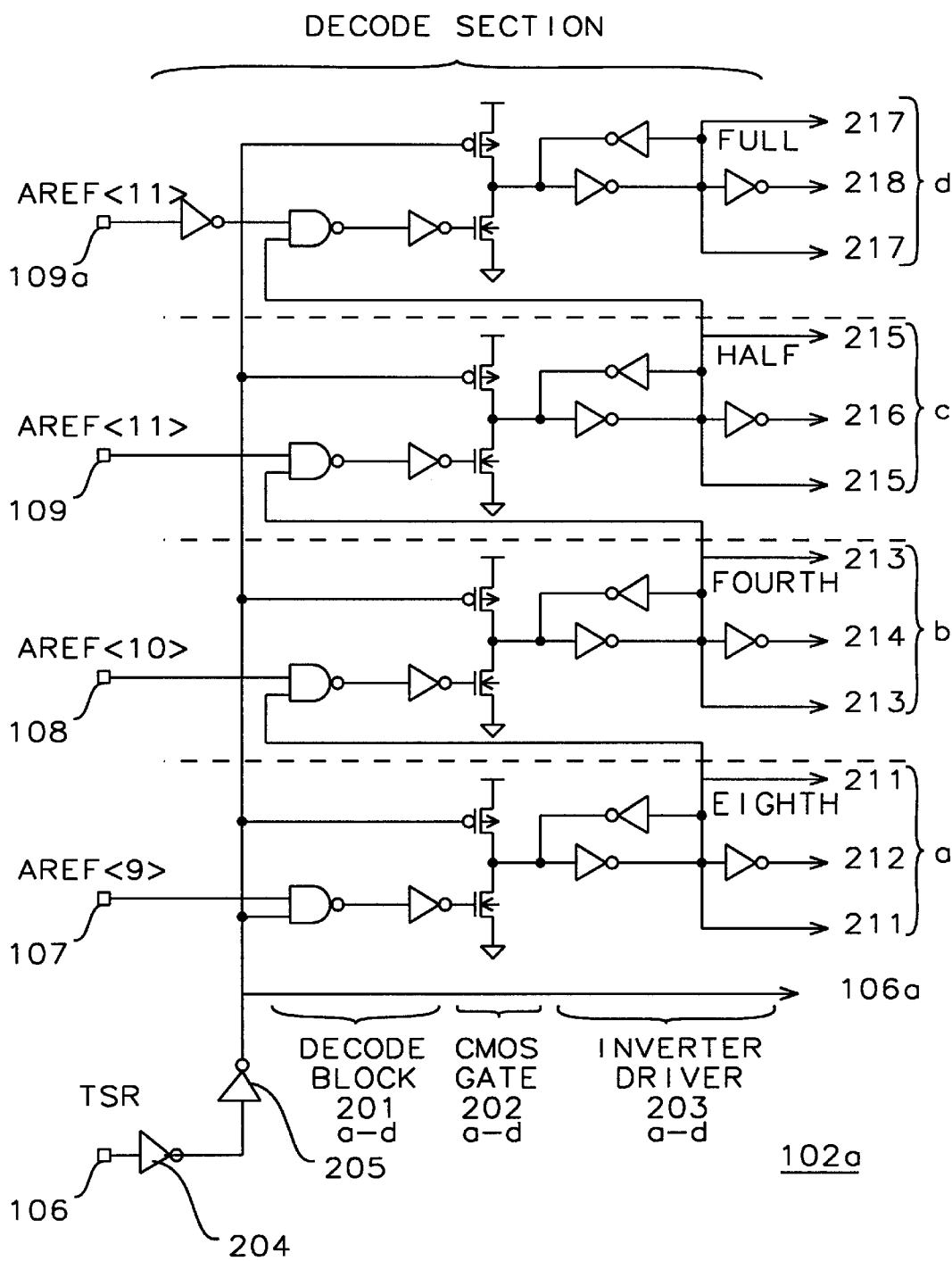
FIG. 2a–b are detailed circuit diagrams of the preferred embodiment of the self-refresh status logic of the present invention.
Figure 2B:
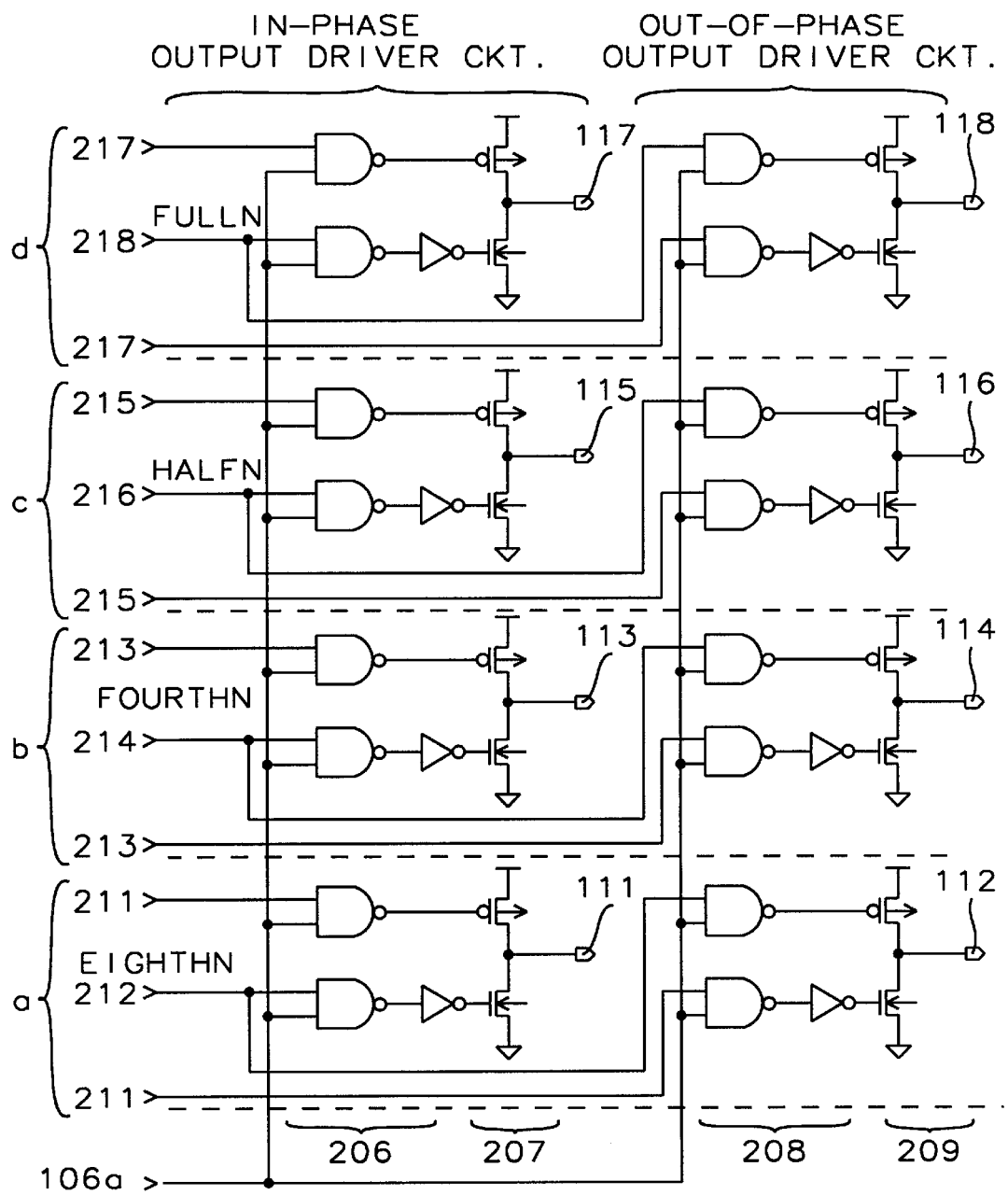

The preferred embodiment of the self-refresh status logic 102 is provided in FIG. 2a and FIG. 2b, but it is obvious to those skilled in the art that this function can be realized through many different circuit implementations. FIG. 2a depicts the decode section 102a showing inputs 106 through 109, and 109a. Outputs 106a, and 211 through 218 connect to the same numbered inputs of output driver circuit 102b of FIG. 2b. Note that in the figures like parts are identified by like numerals or like names.

Referring once more to FIG. 2a, we describe the decode section 102a in somewhat greater detail. There are four identical NAND-Inverter decode blocks 201a–d followed by four identical CMOS gates 202a–d, followed by four identical inverter drivers 203a–d comprised of three inverters each, one of the three inverters providing feedback. When input 106, powered up by inverters 204 and 205, is active and input 107 (aref<9>) is a logical "1", then NAND-Inverter decode block 201a output goes active and turns on the n-channel transistor of CMOS gate 202a, causing its output to switch to ground (the p-channel transistor is gated off by a plus level on the output of inverter 205). This results, via inverter drivers 203a, in output 211 becoming active and output 212 becoming inactive. Output 211 also enables NAND-Inverter decode block 201b which will go active once input 108 (aref<10>) switches to a logical "1", resulting in output pair 213, 214 becoming active. Similarly NAND-Inverter decode block 201c, being now enabled, will go active when input 109 (aref<11>) switches to a logical "1", resulting in output pair 215, 216 becoming active. Lastly, NAND-Inverter decode block 201d will go active once aref<11> at input 109a switches back to logical "0", resulting in output pair 217, 218 becoming active.

Referring to FIG. 2b, we describe the output driver circuit 102b. Inputs 106a, and 211 through 218 connect to the correspondingly numbered outputs of FIG. 2a. Output driver circuit 102b is split into an in-phase output driver circuit and a similar out-of-phase output driver circuit. The in-phase output driver circuit is comprised of a gated logic section 206a–d a CMOS driver 207a–d. The gate to the logic section 206a–d is the test mode signal 106a. Each section 206 is made up of a single NAND gate and a combination of a NAND gate and inverter. The single NAND gate feeds the gate of the p-channel transistor of the CMOS driver 207 while the combination of NAND gate and inverter feeds the gate of the n-channel transistor of the CMOS driver 207. Each of the four sections a–d of the in-phase output driver circuit is dual-railed, receiving in-phase and out-of-phase signals, e.g., the single NAND gate of section 206a receives in-phase input 211 whereas the NAND and inverter combination receives the out-of-phase input 212.

The out-of-phase output driver circuit of FIG. 2b, is identical to the in-phase output driver circuit regarding structure and function. The only difference is at the input where, e.g., the single NAND gate of section 208a receives out-of-phase input 212 whereas the NAND and inverter combination receives the in-phase input 211. Consequently CMOS drivers 209a–d with outputs 112, 114, 116, and 118 deliver out-of-phase signals. The outputs of circuit 102b (111 to 118) are the same outputs as those of self-refresh status logic 102 as mentioned earlier.

In the verification vehicle, the self-refresh status logic activates signals tsrio0 & tsrio0n when 1/8th complete, tsrio1 & tsrio1n when 1/4th complete, tsrio2 & tsrio2n when 1/2 complete, and tsrio3 & tsrio3n when fully completed. The true and complement signals were required to interface to the double-ended I/O bus of the design. The logic can be easily modified to interface to a single ended I/O bus. During normal operation the self-refresh status logic output drivers are tri-stated and when the DRAM is in a device deselect state or in standby mode, these outputs are in Hi-Z (high-impedance) state. When the test mode is entered the four output pairs are driven to an inactive state. This allows for the tester to verify that the DRAM has properly entered the test mode. As each stage of completion is reached the output pairs will be activated and propagated out through each's respective data out pin. Each data out pin, once activated, will remain in the active state until the test mode is reset. This provides greater flexibility in deciding when the tester should strobe the data out pins during the self-refresh test, since the data out pins will not follow the state of their corresponding refresh address bit.

Figure 3:
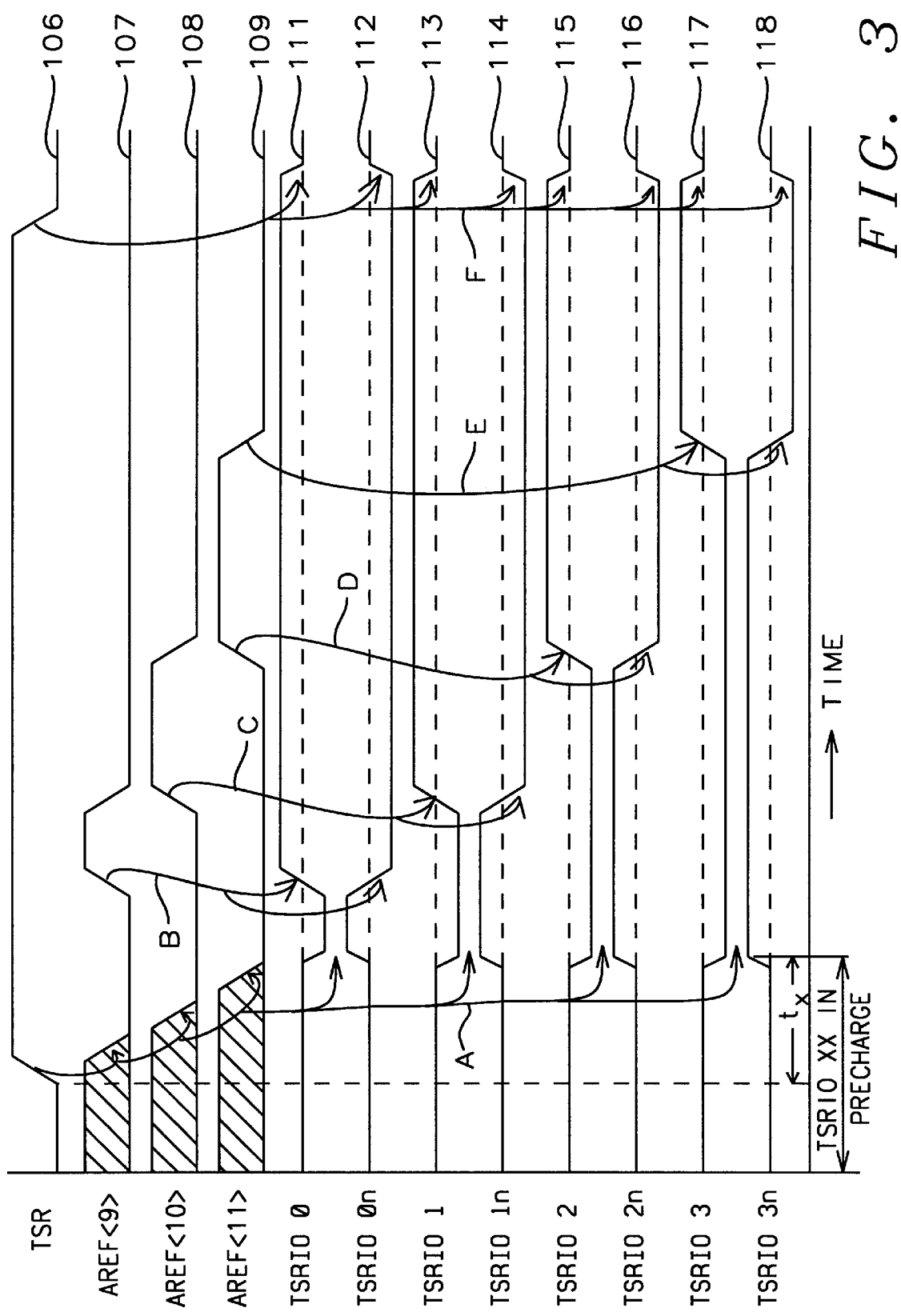
FIG. 3 is a view of the input and output signals of block diagram of FIG. 1.

The above described operations are detailed in the timing diagram of FIG. 3. The timing diagram shows the relation of the test mode indicator tsr (Curve 106), the three refresh addresses aref<9>, aref<10>, and aref<11>, Curves 107, 108 and 109, respectively, and the four I/O pairs tsrio0/0n, tsrio1/1n, tsrio2/2n, and tsrio3/3n, Curves 111 to 118, respectively. Arrows A indicate the resetting of all lines when test mode line tsr, 106 is first activated. Arrows B show the activation of tsrio0 and tsrio0n when aref<9> becomes active. Arrows C show the activation of tsrio1 and tsrio1n when aref<10> becomes active. Arrows D show the activation of tsrio2 and tsrio2n when aref<11> becomes active, and Arrows F show the resetting of all lines, Curves 107 through 118, when tsr goes inactive. All tsrio lines are in precharge from the origin of the timing diagram, or some time before, to the reset of all the tsrio lines. Self-refresh is initiated via a self-refresh command from an external source at some time $t_x$ after tsr is activated. When test mode indicator tsr goes inactive (Curve 106 falls) the output signal (I/O) pairs tsrio0/0n to tsrio3/3n (Curves 111 to 118) switch into a high-impedance state. The timing of this switch is indicated by Arrows F.

Figure 4:
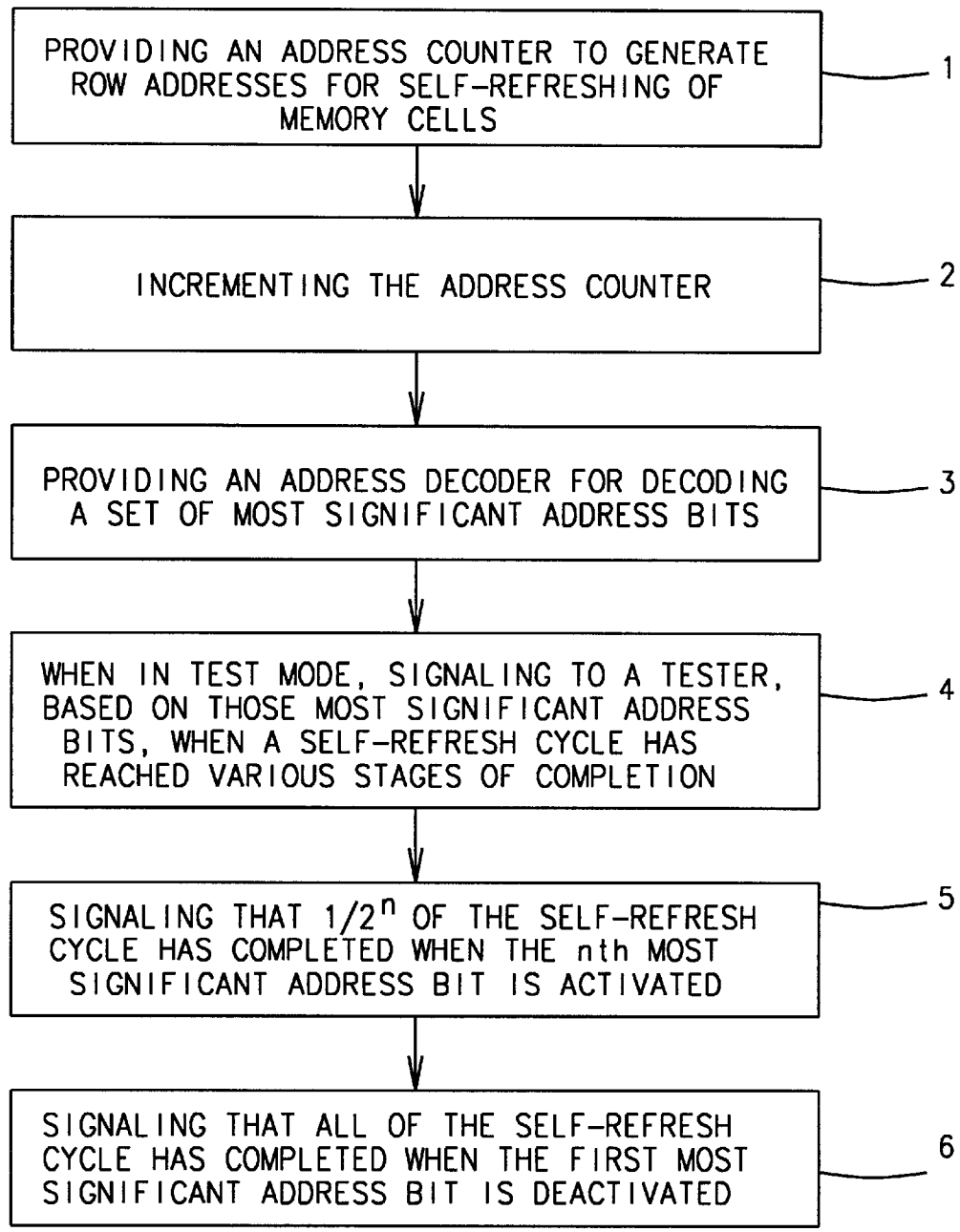
FIG. 4 is a block diagram of the preferred method of the present invention.

Referring now to the block diagram of FIG. 4, we describe the method of determining how much of a self-refresh cycle of an array of dynamic random acess memory (DRAM) cells has completed, comprising the following steps. Block 1 shows providing an address counter to generate row addresses for rows of dynamic random memory cells to be self-refreshed. Block 2 shows incrementing of the address counter. In Block 3 an address decoder is provided for decoding a set of most significant bits of the row addresses. Block 4 provides signaling to a tester when in test mode, based on those most significant bits of the row addresses, when said self-refresh cycle has reached various stages of completion. Block 5 shows signaling to a tester when ½$^n$ of the self-refresh cycle is completed when the nth most significant bit is activated, i.e., activation of the third most significant bit indicates that one eighth of the self-refresh cycle is completed, activation of the second most significant bit indicates that one fourth of the self-refresh cycle is completed, and activation of the first most significant bit indicates that one half of the self-refresh cycle is completed. Lastly Block 6 shows the method of signaling that all of the self-refresh cycle has completed when the first most significant bit is deactivated.

Advantages of the present invention are that it allows for a significant reduction in manufacturing test time necessary to verify the self-refresh oscillator frequency.

While the invention has been particularly shown and described with reference to the preferred embodiments thereof, it will be understood by those skilled in the art that various changes in form and details may be made without departing from the spirit and scope of the invention.

What is claimed is:

1. A circuit for determining how much of a self-refresh cycle of an array of dynamic random memory cells has completed, comprising:
   a refresh address counter operable to generate row addresses for rows of said dynamic random memory cells to be self- refreshed, said refresh address counter generating a count in the form of a plurality of bits, a first bit of said plurality of bits being a first most significant bit, a second bit of said plurality of bits being a second most significant bit, a third bit of said plurality of bits being a third most significant bit, and an nth bit of said plurality of bits being an nth most significant bit;
   a self-refresh status logic operable to generate output signals determined by one or more of said most significant bits, said self-refresh status logic connected to said refresh address counter, said output signals of said self-refresh status logic signaling to a tester means the stages of completeness of said self-refresh cycle; and
   a test mode signal signaling said refresh address counter and said self-refresh status logic when said array of dynamic random memory cells is in test mode.

2. The circuit of claim 1, wherein said refresh address counter has a first input to increment said refresh address counter, a second input to reset said refresh address counter during self-refresh, a third input to reset said refresh address counter when said test mode signal is applied to said third input.

3. The circuit of claim 1, wherein said test mode signal, when active, enables said output signals of said self-refresh status logic.

4. The circuit of claim 1, wherein said test mode signal when not active places said output signals of said self-refresh status logic in a high-impedance state.

5. The circuit of claim 1, wherein said test mode is invoked prior to the start of said self-refresh cycle.

6. The circuit of claim 1, wherein one eighth of said self-refresh cycle is completed when said third most significant bit becomes active.

7. The circuit of claim 1, wherein one fourth of said self-refresh cycle is completed when said second most significant bit becomes active.

8. The circuit of claim 1, wherein one half of said self-refresh cycle is completed when said first most significant bit becomes active.

9. The circuit of claim 1, wherein all of said self-refresh cycle is completed when said first most significant bit becomes inactive.

10. The circuit of claim 1, wherein said self-refresh status logic activates the first of said output signals when one eighth of said self-refresh cycle is completed.

11. The circuit of claim 1, wherein said self-refresh status logic activates the first and the second of said output signals when one fourth of said self-refresh cycle is completed.

12. The circuit of claim 1, wherein said self-refresh status logic activates the first, the second, and the third of said output signals when one half of said self-refresh cycle is completed.

13. The circuit of claim 1, wherein said self-refresh status logic activates the first, the second, the third, and the fourth of said output signals when all of said self-refresh cycle is completed.

14. The circuit of claim 1, wherein any combination of said plurality of bits may be used to signal a particular partial completion of said self-refresh cycle.

15. The circuit of claim 1, wherein any nth most significant bit is used to signal completion of ½$^n$ of said self-refresh cycle.

16. The circuit of claim 1, wherein said self-refresh status logic is further comprised of:
   a decode section with inputs comprised of said first, said second, said third significant bit of said refresh address counter, and said test mode signal, with a first, a second, a third, and a fourth output pair, said first output pair of said self-refresh status logic comprising a signal FULL and its inverse FULLN, said second output pair of said self-refresh status logic comprising a signal HALF and its inverse HALFN, said third output pair comprising a signal FOURTH and its inverse FOURTHN, and said fourth output pair comprising a signal EIGHTH and its inverse EIGHTHN, said decode section decoding said first, said second, and said third input to derive said first, said second, said third, and said fourth output pair; and an output driver circuit with inputs connected to said four pairs of outputs of said decode section and a further input connected to said test mode signal, said output driver circuit having four pairs of outputs, said four pairs of outputs of said output driver circuit labeled tsrio0 and its inverse tsrio0n, tsrio1 and its inverse tsrio1n, tsrio2 and its inverse tsrio2n, and tsrio3 and its inverse tsrio3n, where said signal FULL and its inverse FULLN generate said signal tsrio3 and its inverse tsrio3n, where said signal HALF and its inverse HALFN generate said signal tsrio2 and its inverse tsrio2n, where said signal FOURTH and its inverse FOURTHN generate said signal tsrio1 and its inverse tsrio1n, and where said signal EIGHTH and its inverse EIGHTHN generate said signal tsrio0 and its inverse tsrio0n.

17. A method of determining how much of a self-refresh cycle of an array of dynamic random memory cells has completed, comprising the steps of:
   providing an address counter to generate row addresses for rows of said dynamic random memory cells to be self-refreshed;
   incrementing said address counter;
   providing for an address decoder for decoding a set of most significant bits of said row addresses; and
   signaling to a tester means, based on said most significant bits of said row addresses, when said self-refresh cycle has reached various stages of completion.

18. The method of claim 17, wherein activation of the third of said set of most significant bits indicates that one eighth of said self-refresh cycle is completed.

19. The method of claim 17, wherein activation of the second of said set of most significant bits indicates that one fourth of said self-refresh cycle is completed.

20. The method of claim 17, wherein activation of the first of said set of most significant bits indicates that one half of said self-refresh cycle is completed.

21. The method of claim 17, wherein deactivation of the first of said set of most significant bits indicates that all of said self-refresh cycle is completed.

* * * * *